(12) United States Patent
Zhong et al.

(10) Patent No.: US 9,647,064 B2
(45) Date of Patent: May 9, 2017

(54) SEMICONDUCTOR DEVICE AND RELATED ELECTRONIC DEVICE

(71) Applicant: Semiconductor Manufacturing International (Shanghai) Corporation, Shanghai (CN)

(72) Inventors: Lei Zhong, Shanghai (CN); Hongwei Li, Shanghai (CN); Wei Lei, Shanghai (CN); Huijuan Cheng, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 15/098,889

(22) Filed: Apr. 14, 2016

(65) Prior Publication Data

US 2016/0307883 A1  Oct. 20, 2016

(51) Int. Cl.
*H01L 29/06* (2006.01)
*H01L 27/02* (2006.01)

(52) U.S. Cl.
CPC ...... *H01L 29/0684* (2013.01); *H01L 27/0262* (2013.01); *H01L 29/0649* (2013.01)

(58) Field of Classification Search
CPC ............. H01L 27/0255; H01L 29/0649; H01L 29/0684; H01L 2924/13035; H01L 2924/13034; H01L 2924/13024; H01L 27/0262
See application file for complete search history.

(56) References Cited

U.S. PATENT DOCUMENTS

| 5,574,618 | A | 11/1996 | Croft |
| 6,137,140 | A | 10/2000 | Efland et al. |
| 2007/0069310 | A1* | 3/2007 | Song ................... H01L 29/7436 257/409 |
| 2008/0218922 | A1* | 9/2008 | Mallikararjunaswamy ......... H01L 27/0262 361/91.6 |
| 2009/0283831 | A1* | 11/2009 | Mallikarjunaswamy ......... H01L 27/0251 257/355 |
| 2010/0103570 | A1* | 4/2010 | Song ................... H01L 29/7436 361/56 |
| 2011/0207409 | A1* | 8/2011 | Ker ..................... H01L 27/0262 455/63.1 |
| 2013/0320398 | A1* | 12/2013 | Lai ..................... H01L 27/0262 257/147 |
| 2016/0056146 | A1* | 2/2016 | Li ..................... H01L 27/0259 257/133 |

(Continued)

*Primary Examiner* — Jarrett Stark
(74) *Attorney, Agent, or Firm* — Innovation Counsel LLP

(57) ABSTRACT

A semiconductor device may include the following elements: a first n-type region; a second n-type region; a p-type region, which directly contacts each of the first n-type region and the second n-type region; a first p-type portion, which directly contacts the first n-type region; a first n-type portion, which directly contacts each of the first n-type region and the p-type region; a first electrode, which is electrically connected to each of the first p-type portion and the first n-type portion; a second p-type portion, which directly contacts the second n-type region; a second n-type portion, which directly contacts each of the second n-type region and the p-type region; and a second electrode, which is electrically connected to each of the second p-type portion and the second n-type portion.

18 Claims, 2 Drawing Sheets

(56) References Cited

U.S. PATENT DOCUMENTS

| | | | |
|---|---|---|---|
| 2016/0056147 A1* | 2/2016 | Li | H01L 27/0262 257/173 |
| 2016/0204096 A1* | 7/2016 | Zhao | H01L 21/8222 327/428 |

* cited by examiner

SEMICONDUCTOR DEVICE AND RELATED ELECTRONIC DEVICE

CROSS-REFERENCE TO RELATED APPLICATION

This application claims priority to and benefit of Chinese Patent Application No. 201510175990.9, filed on 15 Apr. 2015; the Chinese Patent Application is incorporated herein by reference in its entirety.

BACKGROUND

The technical field is related to a semiconductor device and an electronic device that includes the semiconductor device.

Semiconductor devices may be included in various electronic devices. For example, semiconductor devices may be included in high-voltage integrated circuits that are used in power management devices, automotive electronic devices, etc. If the semiconductor devices and/or the integrated circuits are not sufficiently protected against electrostatic discharge (ESD) events, performance, reliability, and/or durability of the related electronic devices may be unsatisfactory.

SUMMARY

An embodiment may be related to a semiconductor device. The semiconductor device may include a first n-type region, a second n-type region, a p-type region, a first p-type portion, a first n-type portion, a first electrode, a second p-type portion, a second n-type portion, and a second electrode.

The p-type region may directly contact each of the first n-type region and the second n-type region. The p-type region may be positioned between the first n-type region and the second n-type region.

The first p-type portion may directly contact the first n-type region. The first n-type portion may directly contact each of the first n-type region and the p-type region. The second p-type portion may directly contact the second n-type region. The second n-type portion may directly contact each of the second n-type region and the p-type region. Both the first n-type portion and the second n-type portion may be positioned between the first p-type portion and the second p-type portion.

The first n-type portion may directly contact a junction between the first n-type region and the p-type region. The second n-type portion may directly contact a junction between the second n-type region and the p-type region. The first n-type region and the p-type region may directly contact a same side of the first n-type portion. The second n-type region and the p-type region may directly contact a same side of the second n-type portion.

One of the first electrode and the second electrode may be a cathode. The other one of the first electrode and the second electrode may be an anode. The first electrode may be electrically connected to each of the first p-type portion and the first n-type portion. The second electrode may be electrically connected to each of the second p-type portion and the second n-type portion.

The semiconductor device may have a substantially symmetrical structure. A structure that includes the first p-type portion and the first n-type region (in a cross-sectional view of the semiconductor device) may be a mirror image of a structure that includes the second p-type portion and the second n-type region (in the cross-sectional view of the semiconductor device). A structure that includes the first n-type portion and the first n-type region (in the cross-sectional view of the semiconductor device) may be a mirror image of a structure that includes the second n-type portion and the second n-type region (in the cross-sectional view of the semiconductor device). A structure that includes the first p-type portion, the first n-type portion, and the first n-type region (in the cross-sectional view of the semiconductor device) may be a mirror image of a structure that includes the second p-type portion, the second n-type portion, and the second n-type region (in the cross-sectional view of the semiconductor device). A structure that includes the first electrode, the first p-type portion, the first n-type portion, and the first n-type region (in the cross-sectional view of the semiconductor device) may be a mirror image of a structure that includes the second electrode, the second p-type portion, the second n-type portion, and the second n-type region (in the cross-sectional view of the semiconductor device).

The semiconductor device may include an isolation member. The isolation member may be formed of a dielectric material, may be positioned between the first n-type portion and the second n-type portion, and may directly contact each of the first n-type portion and the second n-type portion. The first n-type portion may be symmetrical to the second n-type portion with reference to the isolation member. A distance from the first p-type portion to the isolation member may be equal to a distance from the second p-type portion to the isolation member.

Two opposite sides of the isolation member may respectively directly contact the first n-type portion and the second n-type portion and may respectively directly contact a first portion of the p-type region and a second portion of the p-type region. Two opposite sides of the first portion of the p-type region may respectively directly contact the first n-type region and the isolation member. Two opposite sides of the second portion of the p-type region may respectively directly contact the second n-type region and the isolation member.

An embodiment may be related to an electronic device. The electronic device may include an electronic component and a semiconductor device. The semiconductor device may be electrically connected to the electronic component and may have one or more of the aforementioned features.

According to embodiments, a semiconductor device may effectively form a low-resistance path for discharging an electrostatic discharge (ESD) current in an ESD event. Therefore, the semiconductor device may be effectively protected against ESD events. Advantageously, satisfactory performance, reliability, and/or durability of the semiconductor device (and a related electronic device) may be attained.

The above summary is related to some of many embodiments disclosed herein and is not intended to limit the scope of embodiments.

DETAILED DESCRIPTION

Figure 1:
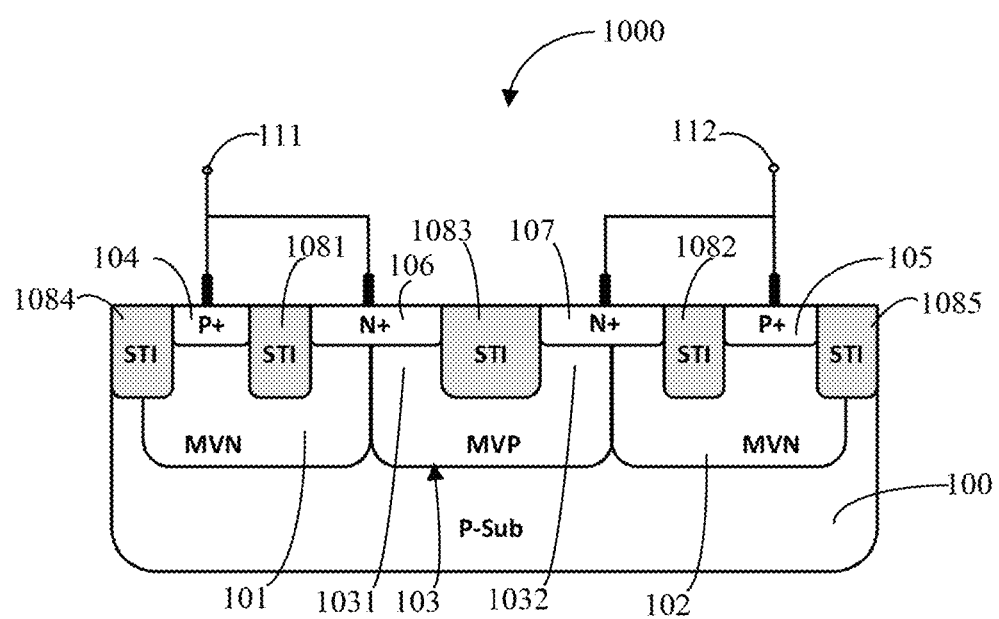
FIG. 1 shows a schematic diagram (e.g., a schematic cross-sectional view) that illustrates elements and/or structures in a semiconductor device in accordance with one or more embodiments.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed below may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors".

The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

FIG. 1 shows a schematic diagram (e.g., a schematic cross-sectional view) that illustrates elements and/or structures in a semiconductor device 1000 in accordance with one or more embodiments. The semiconductor device 1000 may include a substrate 100, which may be a p-type substrate. The semiconductor device 1000 may include an n-type region 101, an n-type region 102, a p-type region 103, a p-type portion 104, an n-type portion 106, an electrode 111, a p-type portion 105, an n-type portion 107, and an electrode 112 that are formed in and/or on the substrate 100. The semiconductor device 1000 may include isolation members, including an isolation member 1083, an isolation member 1081, an isolation member 1082, an isolation member 1084, and an isolation member 1085, that are formed in and/or on the substrate 100.

In the semiconductor device 1000, an electron carrier concentration may be larger than a hole carrier concentration for each n-type element, and a hole carrier concentration may be higher than an electron carrier concentration for each p-type element. One or more of the n-type elements and one or more of the p-type elements may be implemented through one or more doping processes, such as one or more ion implantation processes. Each of the n-type portion 106 and the n-type portion 107 may be a highly doped n-type portion, or N+ portion, and may have a carrier concentration higher than each of a carrier concentration of the n-type region 101 and a carrier concentration of the n-type region 102. Each of the p-type portion 104 and the p-type portion 105 may be a highly doped p-type portion, or P+ portion, and may have a carrier concentration higher than each of a carrier concentration of p-type region 103 and a carrier concentration of the p-type substrate 100.

The p-type region 103, the n-type region 101, and the n-type region 102 may be well structures (or implanted areas). The p-type region 103 may be substantially positioned between a bottom portion of the p-type substrate 100 and at least one of the n-type portion 106 and the n-type portion 107. The p-type region 103 may be a medium-voltage p-well (MVP) and/or may have characteristics of a medium-voltage p-well (MVP), i.e., characteristics of a p-well implanted area of a medium NMOS of the semiconductor device 1000. The n-type region 101 may be substantially positioned between a bottom portion of the p-type substrate 100 and at least one of the n-type portion 106 and the p-type portion 104. The n-type region 101 may be a medium-voltage n-well (MVN) and/or may have characteristics of a medium-voltage n-well (MVN), i.e., characteristics of an n-well implanted area of a first medium PMOS of the semiconductor device 1000. The n-type region 102 may be substantially positioned between a bottom portion of the p-type substrate 100 and at least one of the n-type portion 107 and the p-type portion 105. The n-type region 102 may be a medium-voltage n-well (MVN) and/or may have characteristics of a medium-voltage n-well (MVN), i.e., characteristics of an n-well implanted area of a second medium PMOS of the semiconductor device 1000. Operating voltages associated with one or more of the medium NMOS, the first PMOS, the second PMOS, the p-type region 103, the n-type region 101, and the n-type region 102 may be higher than operating voltages associated with some components (e.g., low-voltage core components) of the semiconductor device 1000 and may be lower than operating voltages associated with high-voltage components of the semiconductor device 1000.

The p-type region 103 may directly contact each of the n-type region 101 and the n-type region 102. The p-type region 103 may be positioned between the n-type region 101 and the n-type region 102. The n-type region 101 may be symmetrical to the n-type region 102 with reference to the p-type region 103.

The p-type portion 104 may directly contact the n-type region 101. The n-type portion 106 may directly contact each of the n-type region 101 and the p-type region 103. The p-type portion 105 may directly contact the n-type region 102. The n-type portion 107 may directly contact each of the n-type region 102 and the p-type region 103. Both the n-type portion 106 and the n-type portion 107 may be positioned between the p-type portion 104 and the p-type portion 105.

The n-type portion 106 may directly contact a junction between the n-type region 101 and the p-type region 103. The n-type portion 107 may directly contact a junction between the n-type region 102 and the p-type region 103. The n-type region 101 and the p-type region 103 may directly contact a same side of the n-type portion 106. The n-type region 102 and the p-type region 103 may directly contact a same side of the n-type portion 107.

The isolation member 1083 may be a shallow trench isolation (STI) member. The isolation member 1083 may be formed of a dielectric material and may isolate the n-type portion 106 and the n-type portion 107 from each other. The isolation member 1083 may be positioned between the n-type portion 106 and the n-type portion 107 and may directly contact each of the n-type portion 106 and the n-type portion 107. The n-type portion 106 may be symmetrical to the n-type portion 107 with reference to the isolation member 1083. A distance from the p-type portion 104 to the isolation member 1083 may be equal to a distance from the p-type portion 105 to the isolation member 1083.

Two opposite sides of the isolation member 1083 may respectively directly contact the n-type portion 106 and the n-type portion 107 and may respectively directly contact a portion 1031 of the p-type region 103 and a portion 1032 of the p-type region 103. Two opposite sides of the portion 1031 of the p-type region 103 may respectively directly contact the n-type region 101 and the isolation member 1083. Two opposite sides of the portion 1032 of the p-type region 103 may respectively directly contact the n-type region 102 and the isolation member 1083.

The isolation member 1081 may be a shallow trench isolation (STI) member and may isolate the n-type portion 106 and the p-type portion 104 from each other. The isolation member 1081 may be a shallow trench isolation (STI) member and may isolate the n-type portion 107 and the p-type portion 105 from each other. The isolation member 1084 and the isolation member 1085 may be shallow trench isolation (STI) members configured for respectively isolating the p-type portion 104 and the p-type portion 105 from other elements.

The electrode 111 may be electrically connected to each of the p-type portion 104 and the n-type portion 106. The electrode 112 may be electrically connected to each of the p-type portion 105 and the n-type portion 107. One of the electrode 111 and the electrode 112 may function as a cathode. The other one of the electrode 111 and the electrode 112 may function as an anode.

The semiconductor device 1000 may have a substantially symmetrical structure, such the function of the electrode 111 and the function of the electrode 112 may be interchangeable. In the substantially symmetrical structure, a structure that includes the p-type portion 104 and the n-type region 101 (in a cross-sectional view of the semiconductor device 1000) may be a mirror image of a structure that includes the p-type portion 105 and the n-type region 102 (in the cross-sectional view of the semiconductor device 1000). In the substantially symmetrical structure, a structure that includes the n-type portion 106 and the n-type region 101 (in the cross-sectional view of the semiconductor device 1000) may be a mirror image of a structure that includes the n-type portion 107 and the n-type region 102 (in the cross-sectional view of the semiconductor device 1000). In the substantially symmetrical structure, a structure that includes the p-type portion 104, the n-type portion 106, and the n-type region 101 (in the cross-sectional view of the semiconductor device 1000) may be a mirror image of a structure that includes the p-type portion 105, the n-type portion 107, and the n-type region 102 (in the cross-sectional view of the semiconductor device 1000). In the substantially symmetrical structure, a structure that includes the electrode 111, the p-type portion 104, the n-type portion 106, and the n-type region 101 (in the cross-sectional view of the semiconductor device 1000) may be a mirror image of a structure that includes the electrode 112, the p-type portion 105, the n-type portion 107, and the n-type region 102 (in the cross-sectional view of the semiconductor device 1000).

When the electrode 112 function as an anode of the semiconductor device 1000 and receives a positive electrical stress caused by electrostatic discharge (ESD), the p-n junction formed by the n-type portion 107 and the p-type region 103 may break down. Consequently, the parasitic NPN bipolar junction transistor formed by the n-type portion 107, the p-type portion 103, and the n-type portion 106 may turn on. Subsequently, the parasitic PNP bipolar junction transistor formed by the p-type portion 105, the n-type region 102, and the p-type region 103 may turn on. The NPN transistor and the PNP transistor may work in a positive feedback model, such that a low resistance path may be formed to effectively discharge the ESD current.

If the anode of the semiconductor device 1000 receives a negative ESD stress, given the substantially symmetrical structure of the semiconductor device 1000, elements of the semiconductor device 1000 may perform operations analogous to the aforementioned operations to effectively discharge the ESD current. If the electrode 111 functions as an anode of the semiconductor device 1000 and receives an ESD stress, elements of the semiconductor device 1000 may perform operations analogous to the aforementioned operations to effectively discharge the ESD current.

Being able to effectively discharge an ESD current, the semiconductor device 1000 may be effectively protected against ESD events. Advantageously, satisfactory performance, reliability, and/or durability of the semiconductor device 1000 (and a related electronic device) may be attained.

The substantially symmetrical structure may also enable the semiconductor device 1000 to satisfy various structural requirements in circuit and/or device designs. For example, the semiconductor device 1000 may be suitable for a stacked circuit structure.

Figure 2:
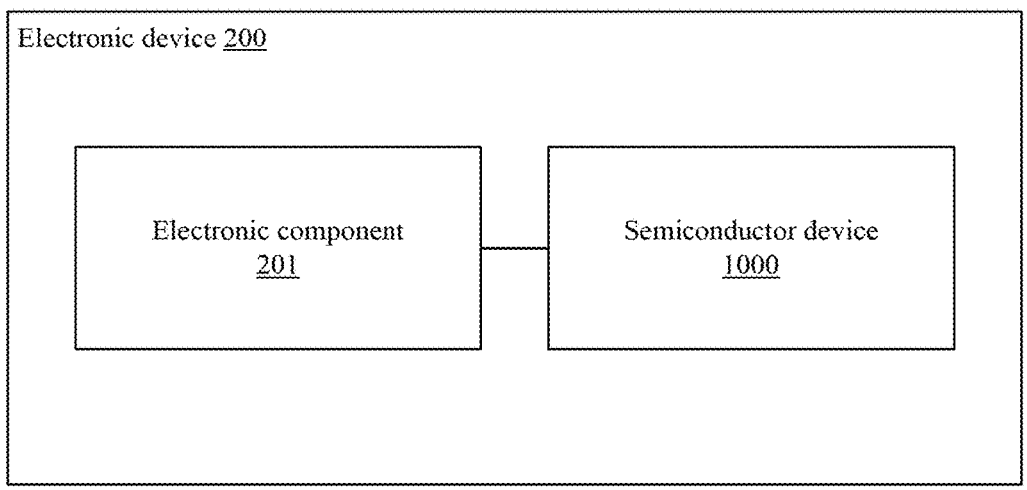
FIG. 2 shows a schematic block diagram that illustrates elements in an electronic device in accordance with one or more embodiments.

FIG. 2 shows a schematic block diagram that illustrates elements in an electronic device 200 in accordance with one or more embodiments. The electronic device 200 may include an electronic component 201 and the semiconductor device 1000 that is electrically connected to the electronic component 201. The semiconductor device 1000 may have the above-discussed features.

In an embodiment, the electronic device 200 may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device 200 may be or may include an intermediate product (e.g., a mobile phone main board) or module including a semiconductor device that may have one or more of the features and advantages discussed above.

According to embodiments, a semiconductor device may effectively form a low-resistance path for discharging an electrostatic discharge (ESD) current in an ESD event. Therefore, the semiconductor device may be effectively protected against ESD events. Advantageously, satisfactory performance, reliability, and/or durability of the semiconductor device (and a related electronic device) may be attained.

While some embodiments have been described as examples, there are alterations, permutations, and equivalents. It should also be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents.

What is claimed is:

1. A semiconductor device comprising:
   a first n-type region;
   a second n-type region;
   a p-type region, which directly contacts each of the first n-type region and the second n-type region;
   a first p-type portion, which directly contacts the first n-type region;
   a first n-type portion, which directly contacts each of the first n-type region and the p-type region;
   a first electrode, which is electrically connected to each of the first p-type portion and the first n-type portion;
   a second p-type portion, which directly contacts the second n-type region;
   a second n-type portion, which directly contacts each of the second n-type region and the p-type region;
   a second electrode, which is electrically connected to each of the second p-type portion and the second n-type portion; and
   an isolation member, which is formed of a dielectric material, wherein two opposite sides of the isolation member respectively directly contact the first n-type portion and the second n-type portion and respectively directly contact a first portion of the p-type region and a second portion of the p-type region.

2. The semiconductor device of claim 1, wherein one of the first electrode and the second electrode is a cathode, and wherein another of the first electrode and the second electrode is an anode.

3. The semiconductor device of claim 1, wherein the p-type region is positioned between the first n-type region and the second n-type region.

4. The semiconductor device of claim 1, wherein both the first n-type portion and the second n-type portion are positioned between the first p-type portion and the second p-type portion.

5. The semiconductor device of claim 1, wherein the first n-type portion directly contacts a junction between the first n-type region and the p-type region.

6. The semiconductor device of claim 5, wherein the second n-type portion directly contacts a junction between the second n-type region and the p-type region.

7. The semiconductor device of claim 1, wherein the first n-type region and the p-type region directly contact a same side of the first n-type portion.

8. The semiconductor device of claim 7, wherein the second n-type region and the p-type region directly contact a same side of the second n-type portion.

9. The semiconductor device of claim 1, wherein a structure that comprises the first p-type portion and the first n-type region is a mirror image of a structure that comprises the second p-type portion and the second n-type region.

10. The semiconductor device of claim 1, wherein a structure that comprises the first n-type portion and the first n-type region is a mirror image of a structure that comprises the second n-type portion and the second n-type region.

11. The semiconductor device of claim 1, wherein a structure that comprises the first p-type portion, the first n-type portion, and the first n-type region is a mirror image of a structure that comprises the second p-type portion, the second n-type portion, and the second n-type region.

12. The semiconductor device of claim 1, wherein a structure that comprises the first electrode, the first p-type portion, the first n-type portion, and the first n-type region is a mirror image of a structure that comprises the second electrode, the second p-type portion, the second n-type portion, and the second n-type region.

13. The semiconductor device of claim 1, wherein the first n-type portion is symmetrical to the second n-type portion with reference to the isolation member.

14. The semiconductor device of claim 1, wherein a distance from the first p-type portion to the isolation member is equal to a distance from the second p-type portion to the isolation member.

15. The semiconductor device of claim 1, wherein both the first n-type portion and the second n-type portion are positioned between the first p-type portion and the second p-type portion.

16. The semiconductor device of claim 14, wherein two opposite sides of the first portion of the p-type region respectively directly contact the first n-type region and the isolation member.

17. The semiconductor device of claim 15, wherein two opposite sides of the second portion of the p-type region respectively directly contact the second n-type region and the isolation member.

18. An electronic device comprising:
an electronic component; and
a semiconductor device electrically connected to the electronic component and comprising:
 a first n-type region;
 a second n-type region;
 a p-type region, which directly contacts each of the first n-type region and the second n-type region;
 a first p-type portion, which directly contacts the first n-type region;
 a first n-type portion, which directly contacts each of the first n-type region and the p-type region;
 a first electrode, which is electrically connected to each of the first p-type portion and the first n-type portion;
 a second p-type portion, which directly contacts the second n-type region;
 a second n-type portion, which directly contacts each of the second n-type region and the p-type region;
 a second electrode, which is electrically connected to each of the second p-type portion and the second n-type portion; and
 an isolation member, which is formed of a dielectric material, wherein two opposite sides of the isolation member respectively directly contact the first n-type portion and the second n-type portion and respectively directly contact a first portion of the p-type region and a second portion of the p-type region.

* * * * *